United States Patent [19]
Yamada et al.

[11] Patent Number: 5,304,811
[45] Date of Patent: Apr. 19, 1994

[54] LITHOGRAPHY SYSTEM USING CHARGED-PARTICLE BEAM AND METHOD OF USING THE SAME

[75] Inventors: Akio Yamada; Yoshihisa Oae; Satoru Yamazaki; Tomohiko Abe, all of Kawasaki, Japan

[73] Assignee: Fujitsu Ltd., Kawasaki, Japan

[21] Appl. No.: 897,050

[22] Filed: Jun. 11, 1992

[30] Foreign Application Priority Data

Aug. 9, 1991 [JP] Japan ................................ 3-200479
Nov. 6, 1991 [JP] Japan ................................ 3-290232

[51] Int. Cl.$^5$ ............................................. H01J 37/00
[52] U.S. Cl. ................................. 250/492.22; 250/398
[58] Field of Search ................ 250/492.2, 492.22, 398, 250/396 R

[56] References Cited

U.S. PATENT DOCUMENTS

| | | | |
|---|---|---|---|
| 4,137,459 | 1/1979 | Albrecht et al. | 250/492.2 |
| 4,362,942 | 12/1982 | Yasuda | 250/492.2 |
| 4,929,838 | 5/1990 | Yasuda et al. | 250/492.2 |
| 5,047,646 | 9/1991 | Hattori et al. | 250/492.2 |
| 5,130,547 | 7/1992 | Sakamoto et al. | 250/492.22 |
| 5,180,919 | 1/1993 | Oae et al. | 250/492.22 |

Primary Examiner—Paul M. Dzierzynski
Assistant Examiner—Kiet T. Nguyen
Attorney, Agent, or Firm—Armstrong, Westerman, Hattori, McLeland & Naughton

[57] ABSTRACT

A lithography system and a method of using the same, wherein a charged-particle beam is deflected to pass through a selected block of stencil pattern on a stencil mask and thereafter the beam forms an image of the stencil pattern on an objective, the lithography system comprising astigmatism and focus compensation coils disposed on both the upstream and downstream sides of the stencil mask, thereby aberration of the incident beam onto the stencil mask being corrected by the astigmatism and focus compensation coils disposed on the upstream side forming a sharp image on the mask, and further aberration of the mask-penetrated beam on the downstream side being corrected by the astigmatism and focus compensation coils disposed on the downstream side forming a sharp image of the stencil pattern on the objective.

18 Claims, 11 Drawing Sheets

OVERLAPPED AREA OF MASK APERTURE AND BEAM

LITHOGRAPHY SYSTEM USING CHARGED-PARTICLE BEAM AND METHOD OF USING THE SAME

BACKGROUND OF THE INVENTION

1. Field of the Invention

The present invention relates to a lithography system using a charged-particle beam for fabricating semiconductor integrated circuits, especially LSIs. More particularly, the present invention relates to a lithography system, in which a charged-particle beam is deflected to pass through a selected block of a stencil pattern on a stencil mask on its way toward an objective and forms an image of the selected stencil pattern thereon.

2. Description of the Related Art

A lithography system using a charged-particle beam, particularly, a system using an electron beam has been widely used for either fabricating a mask or reticle or directly patterning a resist layer on a wafer. Generally, an electron beam lithography system utilizes a rectangularly-shaped electron beam which is produced by making the electron beam pass through two rectangular apertures, the rectangular beam dimensions being adjusted by changing overlapping relation between the two apertures. The rectangular-shaped electron beam is made to move on a wafer under the control of a pattern generating unit. By connecting each exposed rectangular area, the required pattern can be drawn. The electron beam lithography system has established an important position due to its high precision and high speed in patterning.

When the pattern to be drawn on the wafer becomes more intricate and minute, the number of exposure shots increases sharply, which reduces throughput of the lithography system. In order to improve the throughput in exposing superfine patterns, a stencil mask method has been proposed. Generally, an LSI pattern includes a lot of repetition of a basic unit pattern, therefore, if each basic unit pattern can be exposed in one exposure shot, the throughput of exposure can be improved remarkably. The stencil mask comprises a plurality of blocks of basic unit stencil pattern. When an electron beam is made to pass through a selected one of stencil pattern blocks during its progress toward the wafer, an outline of the electron beam is shaped to the selected stencil pattern and the reduced stencil pattern is transcribed on the wafer by one exposure shot. If the exposure shot is repeated plurality of times moving the electron beam on the wafer, the necessary pattern can be exposed comparatively easily in a short time.

It is preferable that many blocks of stencil pattern are formed on the stencil mask and can be accessed by electrically deflecting the electron beam. For example, if a single block of stencil pattern is allowed to occupy a 500 μm square on the stencil mask and an electrically accessible number of stencil pattern blocks is assumed to be one hundred, the exposure unit is required that the electron beam can be deflected over an area of about 6 mm square on the stencil mask.

Further, the electron beam is required to satisfy the following conditions. First, the electron beam can be deflected onto the specific stencil pattern block as described above and the incident beam onto the selected stencil pattern is vertical thereto. Second, the electron beam needs to create a sharp focused image on the stencil mask. Third, the electron beam having displacement from the center axis should be deflected back to the center axis position. Fourth, a sharp focused image of the stencil pattern is to be formed on the wafer.

Two pairs of either electrostatic or electromagnetic deflectors, each pair disposed in opposed relationship with regard to the stencil mask, deflect the electron beam onto the selected stencil pattern from the axis and deflect back to the axis, satisfying the above first and third conditions. However, due to the large beam displacement from the center axis, beam aberration problems such as astigmatism and field curvature can not be avoided. Both problems cause a blurred image on either the stencil mask or the wafer. In order to solve the problems, deflection and focus system of the exposure unit should be separated into two, one on the upstream side of the stencil mask and the other on the downstream side thereof. The above problems should be solved for both upstream and downstream sides of the stencil mask.

SUMMARY OF THE INVENTION

An object of the present invention is to provide a lithography system, wherein a charged-particle beam is deflected to pass through a selected block of stencil pattern on a stencil mask and thereafter the beam forms an image of the stencil pattern on an objective, the lithography system comprising a compensation coil disposed on the downstream side of the mask, thereby aberration of the mask-penetrated beam being corrected forming a sharp image of the stencil pattern on the objective.

Another object of the present invention is to provide a lithography system, wherein a charged-particle beam is deflected to pass through a selected block of stencil pattern on a stencil mask and thereafter the beam forms an image of the stencil pattern on an objective, the lithography system comprising a compensation coil disposed on the upstream side of the mask, thereby aberration of the incident beam onto the mask being corrected forming a sharp image on the stencil mask.

Still another object of the present invention is to provide a lithography system, wherein a charged-particle beam is deflected to pass through a selected block of stencil pattern on a stencil mask and thereafter the beam forms an image of the stencil pattern on an objective, the lithography system comprising compensation coils disposed on both the upstream and downstream sides of the stencil mask, thereby aberration of the incident beam onto the stencil mask being corrected by the compensation coil disposed on the upstream side forming a sharp image on the mask and further aberration of the mask-penetrated beam being corrected by the compensation coil disposed on the downstream side forming a sharp image of the stencil pattern on the objective.

A further object of the present invention is to provide a method of exposure using a lithography system, particularly, a method of controlling the compensation coil in any of the above lithography systems.

A still further object of the present invention is to provide a lithography system, wherein a charged-particle beam is deflected to pass through a selected block of stencil pattern on a stencil mask and thereafter the beam forms an image of the stencil pattern on an objective, the lithography system comprising first and second magnetic lenses respectively arranged on both sides of the stencil mask and in the close vicinity thereof, and further a mask inlet deflector arranged inside the first magnetic lens and a mask outlet deflector arranged inside the second magnetic lens.

The aberration of charged-particle beam in the above lithography system is classified in two main distinct types, namely, astigmatism and field curvature. The above lithography system comprises compensation coils for correcting respectively astigmatism and field curvature.

Other objects and advantages of the present invention will be apparent from the detailed description to follow taken in conjunction with the appended claims.

BRIEF DESCRIPTION OF THE DRAWINGS

Throughout the drawings, the same reference numerals designate and identify the same or similar parts.

DETAILED DESCRIPTION OF THE PREFERRED EMBODIMENTS

Figure 1:
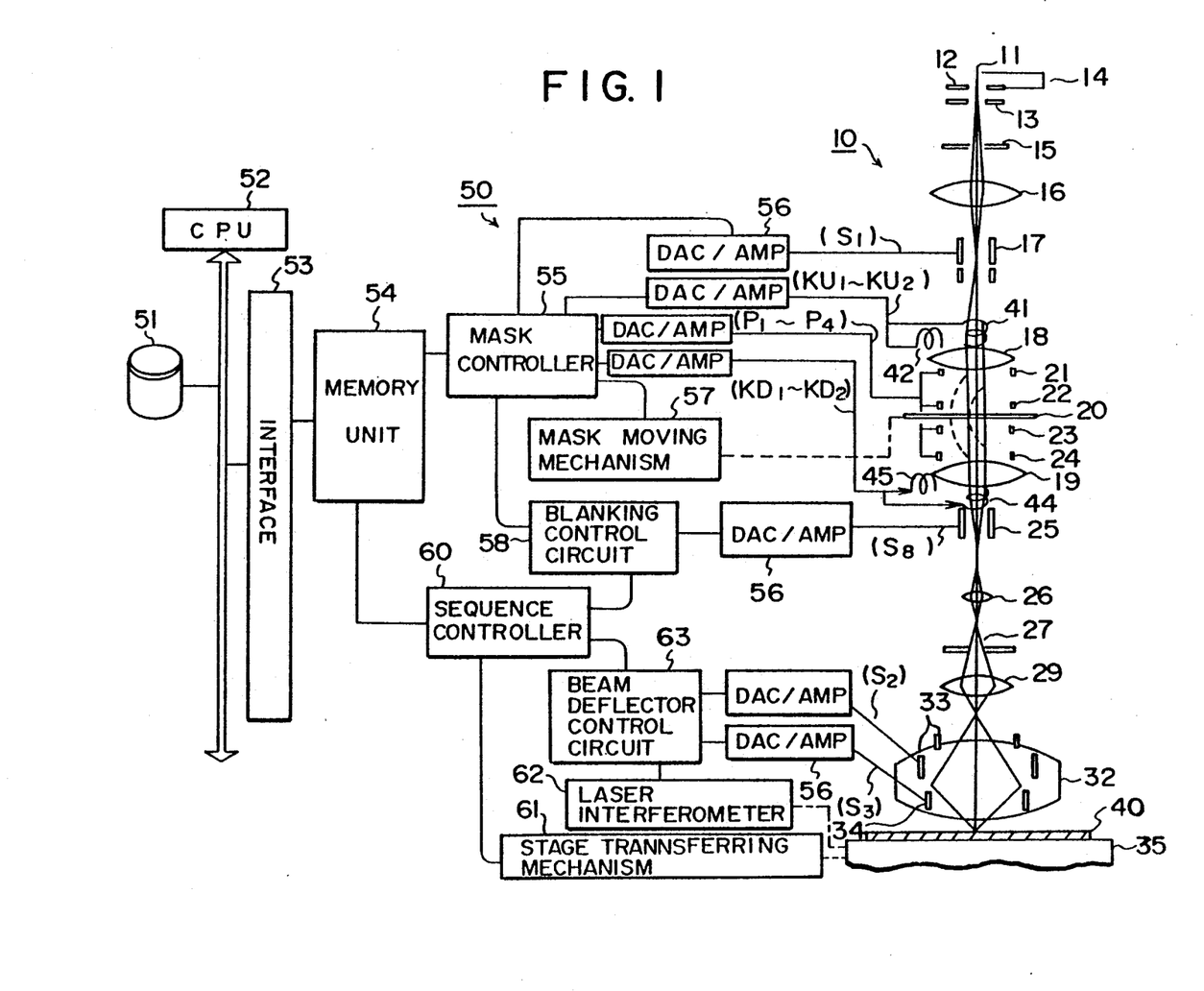
FIG. 1 is a schematic view of an exposure system composed of two main units, i.e., an exposure unit and a control unit to which the present invention is applied.

FIG. 1 schematically shows a charged-particle beam lithography system in accordance with the present invention. The system is divided into two main units, namely, an exposure unit 10 and a control unit 50. In the exposure unit 10, an objective is subjected to an exposure of the charged-particle beam, whereby the beam outline is shaped to a specified stencil pattern on a stencil mask and forms the reduced stencil pattern on the objective. The control unit 50 generates a plurality of control signals which are needed for the exposure unit 10.

Figure 10A:
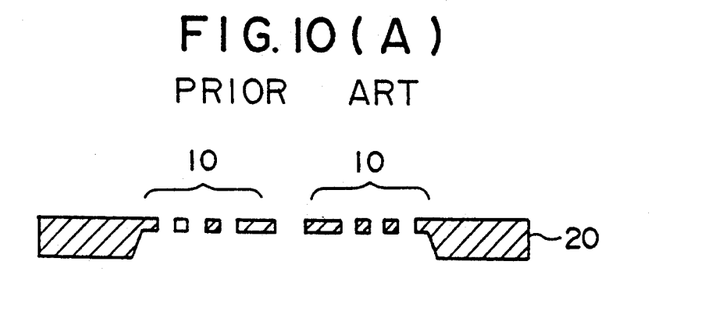
FIGS. 10(a) and 10(b) schematically show a cross sectional view and a top view of an existing stencil mask.
Figure 10B:
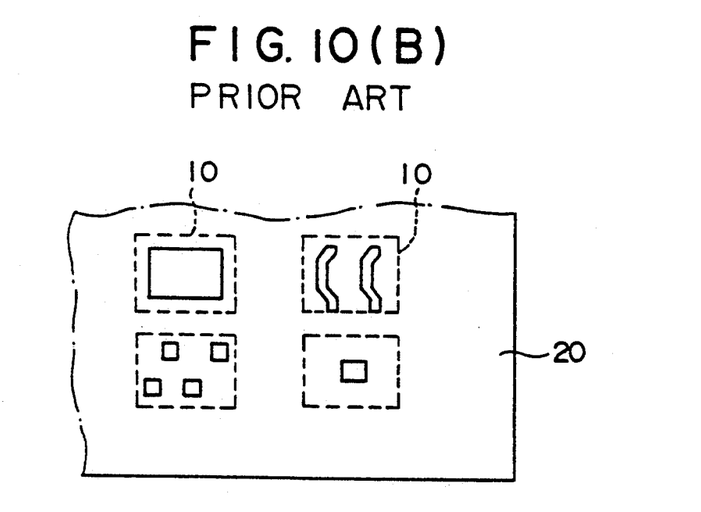

In the exposure unit 10, the charged-particle beam, for example, an electron beam, is generated from a charged-particle source 14 which comprises a cathode 11, a grid 12 and an anode 13. The ejected electron beam passes through a beam shaping aperture 15 which shapes outline of the electron beam in a rectangular form, and the electron beam further passes through a magnetic lens 16 for convergence, and a deflector 17 having a function of minor correction of the beam position on a stencil mask 20. The electron beam further goes to a magnetic lens 18 by which the electron beam is converged to a parallel beam to the center axis, A stencil mask 20 of the present invention comprises a plurality of stencil pattern blocks. A cross section of the stencil mask 20 and a partial top view thereof is shown in FIGS. 10(a) and 10(b) respectively. Each block of stencil pattern 10 has dimensions of, for example, 300×300 μm which is reduced to 3×3 μm on a wafer and one stencil mask 20 comprises several tens to a few hundreds of stencil pattern blocks 10.

The electron beam is controlled to pass through one selected block of stencil pattern on the stencil mask 20 vertically. For this purpose, a first mask inlet deflector 21 and a second mask inlet deflector 22 are arranged between the magnetic lens 18 and the stencil mask 20. The first mask inlet deflector 21 deflects the beam to the specified position according to the selected block of stencil pattern on the stencil mask 20 and the second mask inlet deflector 22 changes the beam direction vertical to the stencil mask. The electron beam passing through the specific block of stencil pattern goes through a first mask outlet deflector 23 and a second mask outlet deflector 24 arranged on the downstream side of the stencil mask 20, thereby the electron beam being deflected by the first mask outlet deflector 23 toward the center axis and further deflected by the second mask outlet deflector 24 such that the electron beam is parallel to the axis. The magnetic lens 19 converges the electron beam.

Thereafter, the electron beam passes through a blanking electrode 25, a reduction magnetic lens 26, a round aperture 27, projection magnetic lenses 29, 32, a main deflector 33 and a sub-deflector 34. The blanking electrode 25 has a function of allowing or cutting-off the beam penetration. The above plurality of magnetic lenses 26, 29, 32 have a function of forming a stencil pattern image with a predetermined reduction ratio and the deflectors 33, 34 have a function of deflecting the electron beam, resulting in forming the stencil pattern image repeatedly on the successive positions on the objective 40 such as a wafer. The objective 40 is disposed on a stage 35 which is movable in the X and Y directions.

The exposure unit 10 further comprises a plurality of coils for precise alignment and focus adjustment of a charged particle beam, however, these parts are similar as those used in the conventional electron beam exposure apparatus, therefore, these are not shown in the FIG. 1 and details are omitted.

The specific feature of the exposure unit 10 of the present invention is that a focus compensation coil 41 for correcting field curvature (image being formed on a spherical surface) and an astigmatism compensation coil 42 for correcting astigmatism are arranged on the upstream side of the stencil mask 20, and a focus compensation coil 44 for correcting field curvature and an astigmatism compensation coil 45 for correcting astigmatism are arranged on the downstream side thereof. The detailed structure and function of these coils are described later.

The control unit 50 of FIG. 1 outputs all necessary signals for controlling the exposure unit 10. A CPU 52 has a function of controlling the whole lithography system. All data of related integrated circuits, mask information and other information necessary for exposure are stored in a storage memory 51 and read out by the CPU 52. The read out information such as pattern sequence information necessary for exposing the stencil pattern sequentially on the wafer 40, necessary stencil mask information for exposure, etc., are transmitted through an interface 53 to a data memory 54 and stored therein.

On receiving the information from the data memory 54, a mask controller 55 outputs signals $P_1$ to $P_4$ which are to be applied respectively to the first and second mask inlet deflectors 21, 22 and the first and second mask outlet deflectors 23, 24, whereby the electron beam is deflected first by signal $P_1$ toward the selected block position of stencil mask 20 and then deflected by signal $P_2$ vertical to the stencil mask 20 and, after passing through the stencil pattern, the electron beam is deflected back by signal $P_3$ toward the axis and then deflected by signal $P_4$ parallel to the axis. The mask controller 55 outputs further correction signals $KU_1$, $KU_2$ which are applied to correction coils 41, 42 respectively, and correction signals $KD_3$, $KD_4$ which are applied to correction coils 44, 45 respectively. The mask controller 55 outputs further a correction signal $S_1$ which is applied to the deflector 17. The mask controller 55 also controls a mask transferring mechanism 57 which moves the stencil mask 20, and a blanking signal generator 58 which outputs a blanking signal $S_B$ to the blanking electrode 25. In the actual system, all signals need digital/analog conversion, therefore, a plurality of digital-analog-converter and amplifiers (DAC/AMP) 56 are inserted in the respective circuits.

A sequence controller 60 connected to the data memory 54 controls a step sequence of describing the stencil pattern on the wafer 40. A stage transferring mechanism 61 and a laser interferometer 62 are operatively coupled with the sequence controller 60 and a beam deflector control circuit 63. The beam deflector control circuit 63 outputs beam positioning signals $S_2$, $S_3$ to the main deflector 33 and the sub-deflector 34 via DAC/AMPs 56, respectively, and the stage transferring mechanism 61 controls the movement of the stage 35.

Aberration appearing in the exposure unit 10 utilizing the stencil mask is divided into two sections, namely, one appearing on the upstream side of the stencil mask 20 mainly due to a large displacement of the electron beam from the center axis caused by first and second mask inlet deflectors 21, 22 and the other appearing on the downstream side thereof caused by first and second mask outlet deflectors 23, 24. As described previously, the embodiment of the present invention comprises astigmatism compensation coils 42, 45 and focus compensation coils 41, 44, disposed in opposed relationship with respect to the stencil mask 20. The focus compensation coil 41 and the astigmatism compensation coil 42 are used for correcting aberration of incoming electron beam onto the stencil mask 20, and the focus compensation coil 44 and the astigmatism compensation coil 45 are used for correcting aberration of outgoing electron beam from the stencil mask 20 toward the aperture electrode 27 and wafer 40.

Figure 11:
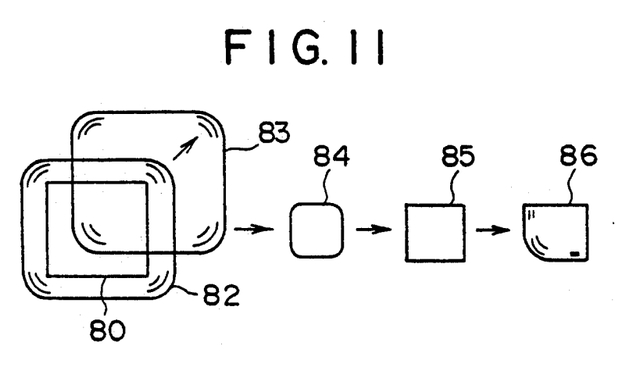
FIG. 11 illustrates change in outline shape of an electron beam before and after correcting aberration on the downstream side of a stencil mask.

The aberrations appearing on both sides of the stencil mask 20 are illustrated in FIG. 11, in which a square hole 80 is assumed as one block of simple stencil pattern on the stencil mask and an electron beam having a cross section 82 is projected on the stencil pattern 80 covering the entire pattern. The electron beam which has just penetrated through the stencil pattern 80 has a precise square cross section, but a beam image formed on a wafer shows pattern 84 having, for example, round corners if no compensation is done to the electron beam on the downstream side of the stencil mask. When compensation using the focus compensation coil 44 and the astigmatism compensation coil 45 on the downstream side of the stencil mask is performed, the beam image shows a precise square pattern 85. However, when the electron beam moves, as shown by a pattern 83 on the stencil mask, portions of left and bottom sides of the electron beam cross section are not shaped by the stencil pattern 80 and the aberration on the upstream side of the stencil mask appears in the image on the wafer, which is shown as a beam pattern 86.

In the following, an easy and rough method of adjusting the compensation coils 44, 45 and then 41, 42 respectively on the downstream and upstream sides of the stencil mask 20 is first described (Method I), and next precise methods of adjusting the compensation coils 44, and 45 on the downstream side (Method II) and thereafter adjusting the compensation coils 41, 42 on the upstream side (Method III) are separately described.

Compensation Method I

This method utilizes a calibration pattern mask which comprises a plurality of first stencil patterns and a plurality of second stencil patterns, each of first and second stencil patterns having a rectangular opening respectively smaller and larger than a cross section of an electron beam on the calibration pattern mask. Sometimes, two calibration pattern masks may be used, a first calibration pattern mask comprising a plurality of first stencil patterns and a second calibration pattern mask comprising a plurality of second stencil patterns.

By adjusting mask inlet deflectors 21, 22, the electron beam is projected on a specified first stencil pattern covering the entire stencil pattern. The mask-penetrated beam progresses and forms an image on a wafer, thereby both the compensation coils 44 and 45 being adjusted such that the beam forms a sharp rectangular image on the wafer as much as possible. The sharpness of the image can be measured by the conventional method using a detector for reflected electrons from the wafer. These steps are repeated for the other first stencil patterns on the calibration pattern mask having different distances from the axis, and compensation coil currents for stencil patterns having different distances can be obtained and data are recorded in a memory unit.

Next, in the similar way as in the case of the first stencil patterns, the electron beam is projected on a specified second stencil pattern. In this case, the entire electron beam is made to penetrate through the selected stencil pattern and the compensation currents which have been obtained in the previous steps are made to flow through the compensation coils 44 and 45. The mask-penetrated electron beam forms an image on the wafer, however, the image comprises aberration of the electron beam caused during the beam progress on the upstream side of the calibration pattern mask, because the aberration on the downstream side has been already corrected by the compensation currents through compensation coils 44, 45. Therefore, the compensation coils 41, 42 on the upstream side of the stencil mask are adjusted such that a sharp rectangular image can be obtained again on the wafer as much as possible. Thus obtained current data for compensation coils 41, 42 are recorded in the memory unit, and the steps are repeated for other stencil patterns having different distances from the axis, and the data are recorded. Thus current data for the compensation coils 41, 42, 44, 45 for all stencil patterns can be obtained.

Compensation Method II

Compensation method II provides another method of correcting aberration on the downstream side of the stencil mask more precisely. It is assumed that an electron beam having a rectangular cross section of 400×400 μm is projected on the circular stencil pattern having a dimension of 300 μm in diameter, which results in shaping the outgoing electron beam to a precise circular outline having a diameter of 300 μm and cutting off the peripheral portion of the incoming rectangular electron beam.

Figure 2:
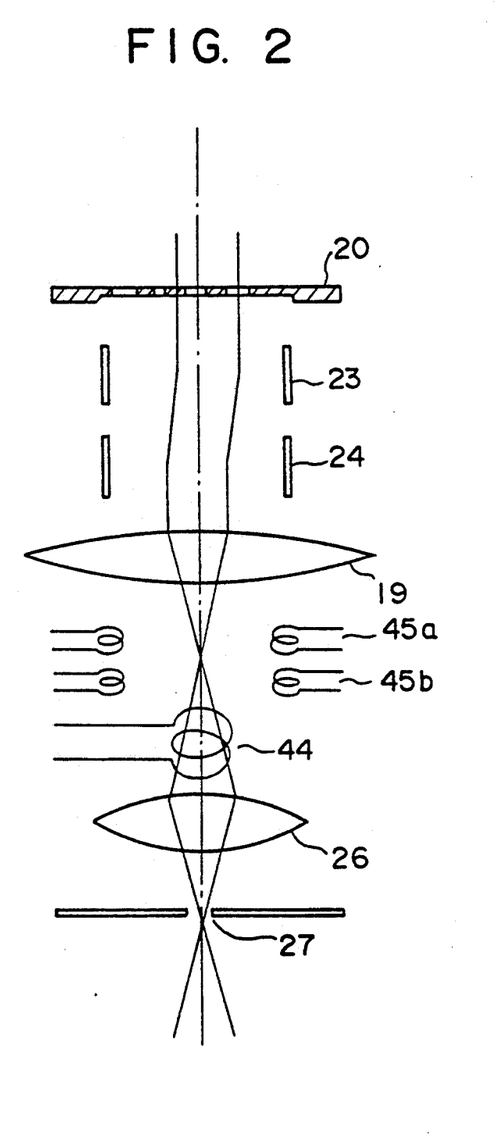
FIG. 2 is a schematic partial cross sectional view of an exposure unit in which compensation coils of the present invention and the related parts for correcting aberration on the downstream side of a stencil mask are illustrated.

FIG. 2 shows a schematic enlarged view of a portion of the downstream side of stencil mask 20, in which astigmatism compensation coil 45 composed of two coils 45a, 45b, focus compensation coil 44 are shown together with first and second mask outlet deflectors 23, 24, magnetic lens 19, reduction magnetic lens 26 and round aperture 27. As shown in the figure, astigmatism compensation coil 45 is composed of the upper coil 45a and the lower coil 45b stacked together in order to make more precise adjustment possible.

Herein, it is assumed that the outgoing electron beam from the selected block of stencil pattern has a precise beam cross section same as the stencil pattern and beam peripheral portion which includes the astigmatism on the upstream side, is cut off by the stencil mask. Therefore, astigmatism at the aperture 27 mainly develops during beam progress on the downstream side of the stencil mask 20 and is caused by the beam deflection using the mask outlet deflectors 23 and 24 in restoring the electron beam to the original axial beam.

Figure 3A:
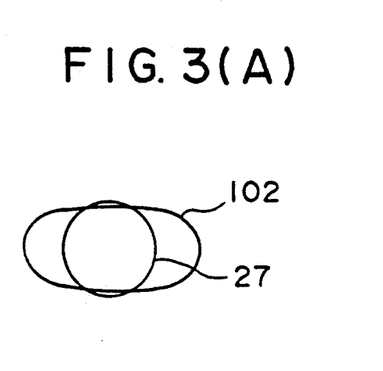
FIGS. 3(a) and 3(b) illustrate schematically astigmatism on the downstream side of a stencil mask in an exposure unit.
Figure 3B:
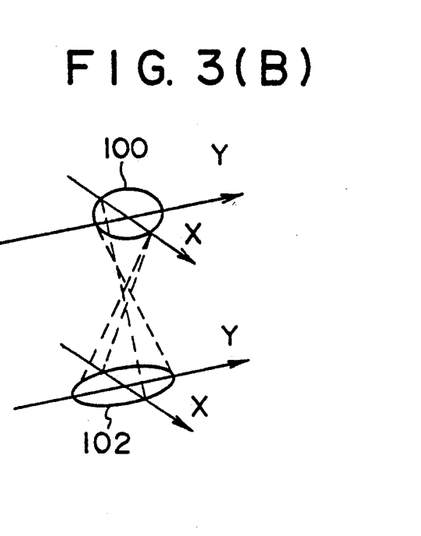

A cross section of the electron beam is deformed due to the astigmatism such that, for example, a circular beam 100 outgoing from the stencil pattern is deformed to an elliptical beam shape 102 on the aperture 27. This is schematically shown in FIGS. 3(a) and 3(b). A part of the electron beam is cut off by the aperture 27, with the result of forming a waned beam pattern or a beam pattern with dark spots on the wafer.

Figure 4A:
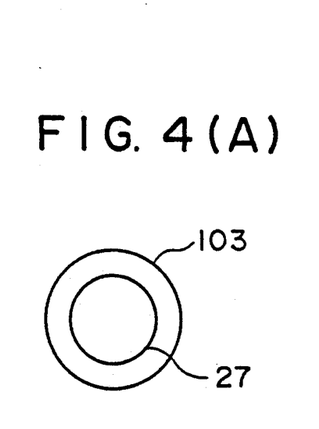
FIGS. 4(a) and 4(b) illustrate schematically field curvature on the downstream side of a stencil mask in an exposure unit.
Figure 4B:
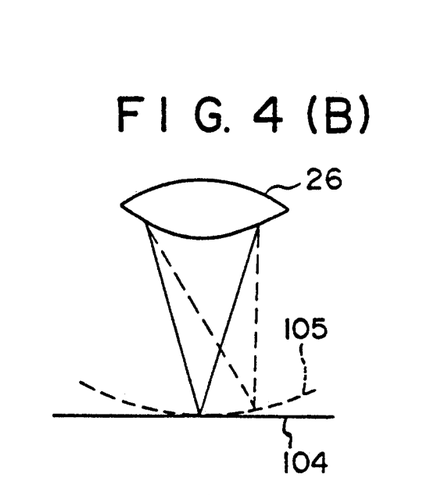

In another case, when the electron beam is subjected to a large deflection, an image surface deviates from a flat surface 104 to a curved surface 105 (beam focuses on a curved surface) as shown in FIG. 4(b) and, as the result, the circular outgoing electron beam from the stencil mask shows an enlarged beam shape 103 on the aperture 27, which is larger than the ideal circular beam shape, which is schematically shown in FIG. 4(a).

Figure 5A:
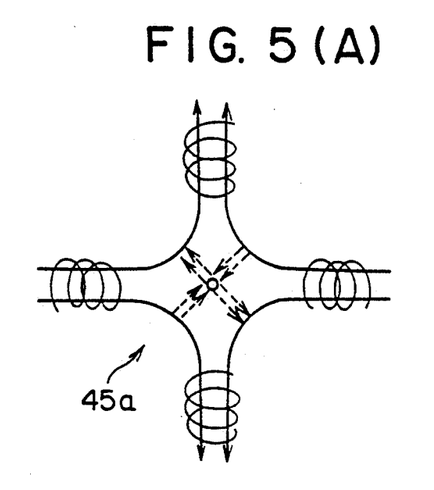
FIGS. 5(a) and 5(b) show a schematic top view of a pair of astigmatism compensation coils of the present invention.
Figure 5B:
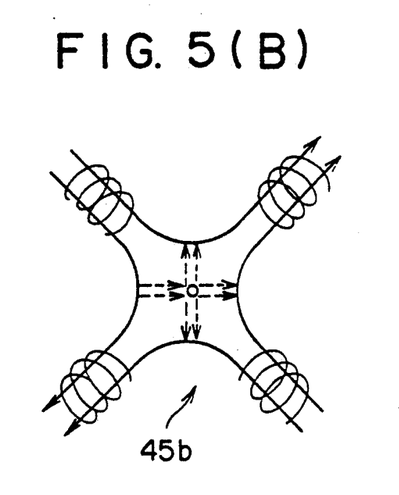

In order to eliminate the astigmatism on the aperture, a pair of astigmatism compensation coils 45a, 45b are utilized. A schematic plan view of these upper and lower coils 45a, 45b are shown in FIGS. 5(a) and 5(b) respectively, in which solid curves show direction of magnetic field, and dotted arrows show direction of force onto the electron beam. Using the outgoing electron beam from a circular stencil pattern located at the specified position on the stencil mask, the astigmatism compensation steps are as follows.

Figure 6A:
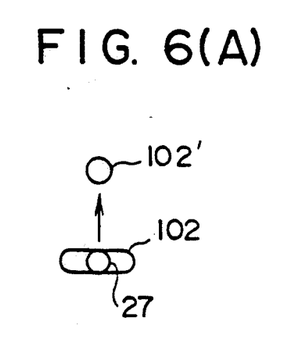
FIGS. 6(a) and 6(b) illustrate an electron beam behavior on an aperture electrode while adjusting astigmatism compensation coil on the downstream side of a stencil mask according to the present invention.

(1) A current flowing through the astigmatism compensation coil is changed slightly, which causes a change of the beam shape (from 102 to 102') and also makes the beam deflect slightly due to the magnetic field change caused by the astigmatism compensation coil, which is shown in FIG. 6(a).

Figure 6B:
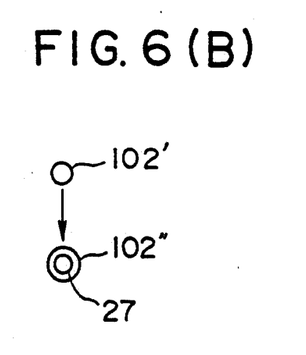

(2) The electron beam position which has moved in step (1), is restored to the initial aperture position (from 102' to 102") by slightly adjusting the deflection amount of the mask inlet and outlet deflectors 21, 22, 23, 24, this is shown in FIG. 6(b). This adjustment by the mask deflectors causes a slight direction change of the electron beam off from the axial direction (not shown in the figures). This shift amount can be measured by a focal position shift on the wafer. Therefore, the mask inlet and outlet deflectors are again adjusted such that (beam current penetrated through the aperture)/(amount of the beam shift on the wafer) becomes maximum.

Figure 7:
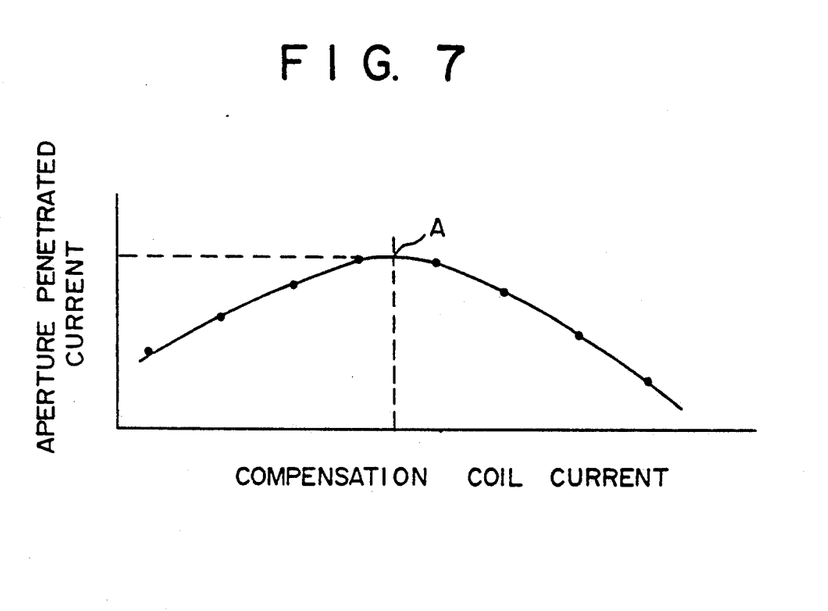
FIG. 7 shows relation between astigmatism compensation coil current and aperture-penetrated current.

(3) Recording the aperture-penetrated current and the astigmatism compensation coil current in steps (1) and (2), these steps are repeated plural times by changing the astigmatism compensation coil current. The data are plotted as shown in FIG. 7, in which the maximum point A on the curve gives the required astigmatism compensation coil current.

Figure 8:
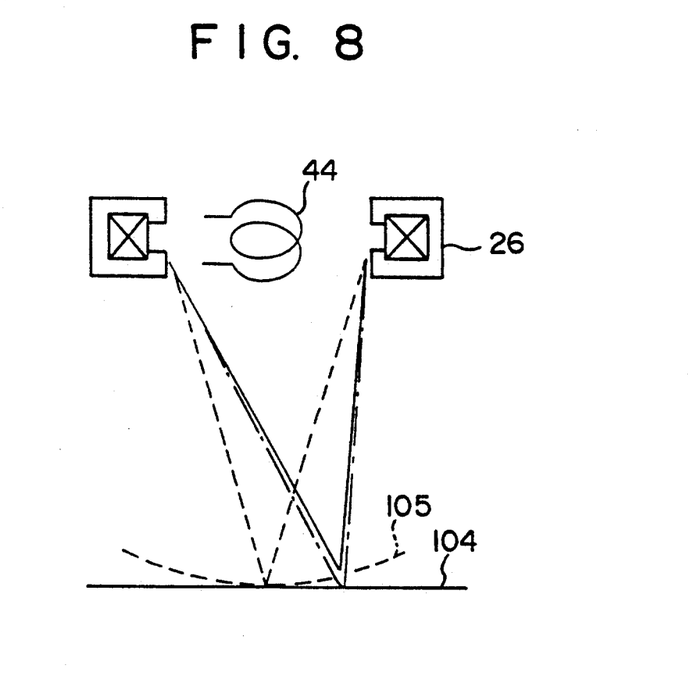
FIG. 8 illustrates schematically function of focus compensation coil on the downstream side of a stencil mask.

Next, the field curvature can be compensated using the focus compensation coil 44 shown in FIGS. 1 and 2. FIG. 8 illustrates schematically function of the focus compensation coil 44. When the electron beam is subjected to the deflection of mask deflectors 21, 22, 23 and 24, a focal point of the electron beam formed by the magnetic lenses 19, 26 describes a curved surface 105 without the function of focus compensation coil 44, however, focal point can be corrected to be on a plain surface 104 by supplementing compensating magnetic field using the focus compensation coil 44 (adding an inverse magnetic field for making the magnetic field weaker). The compensation steps are similar as in the case of astigmatism compensation, and details are as follows.

Figure 9A:
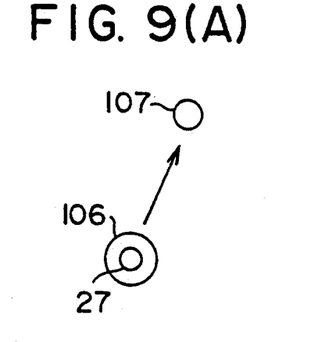
FIGS. 9(a) and 9(b) illustrate an electron beam behavior on an aperture electrode while adjusting focus compensation coil on the downstream side of a stencil mask according to the present invention.

(1') A current flowing through the focus compensation coil 44 is changed slightly, which causes a small change of the electron beam outline shape and also makes the electron beam move slightly due to the magnetic field change caused by the focus compensation coil. In FIG. 9(a), the electron beam 106 advancing toward the aperture 27 moves to position of electron beam 107.

Figure 9B:
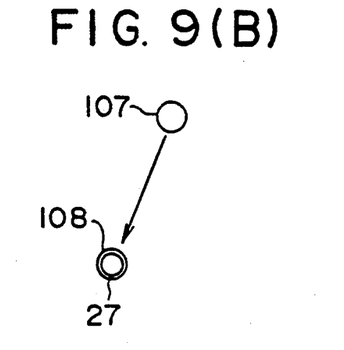

(2') The electron beam position which has moved slightly in step (1'), is restored again to the original beam position 108 by slightly adjusting the deflection amount of the mask inlet and outlet deflectors 21, 22, 23, 24 as shown in FIG. 9(b). This adjustment by the mask deflectors causes a slight direction change of the electron beam off from the axial direction. This shift amount can be measured by a focal position shift on the wafer.

Therefore, the mask inlet and outlet deflectors are again adjusted such that (beam current penetrated through the aperture)/(amount of the beam shift on the wafer) becomes maximum.

(3') Recording the aperture penetrated current and the focus compensation coil current in steps (1') and (2'), these steps are repeated plurality of times by changing the focus compensation coil current. The data are plotted in the similar way as the previous case of FIG. 7, and the maximum point on the plotted curve gives the required focus compensation coil current.

The above steps (1) to (3) and the steps (1') to (3') are repeated for other block positions of stencil pattern, and the compensation current data thus obtained are stored in the data memory 54 and storage memory 51 in the control unit 50.

Compensation Method III

Figure 12A:
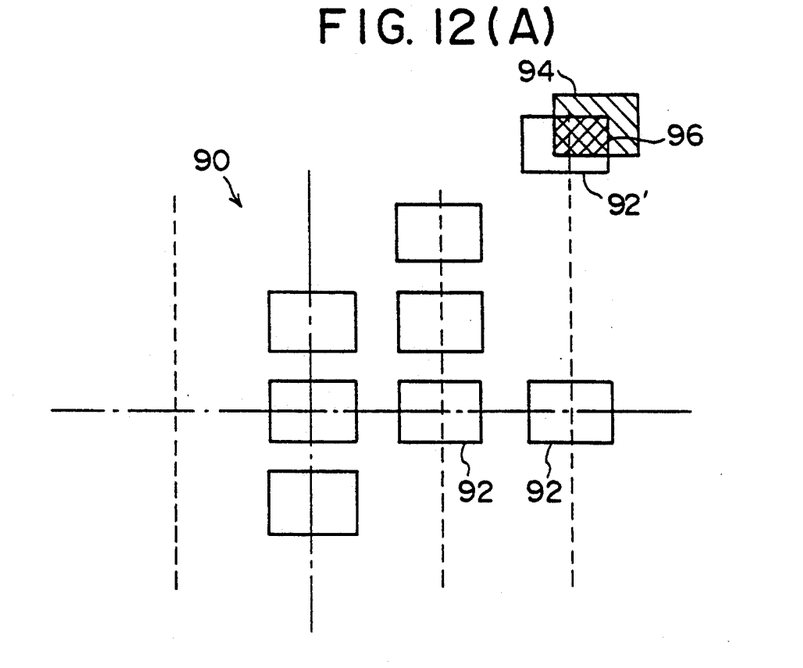
FIGS. 12(a) and 12(b) respectively shows a calibration mask and a characteristic of a beam current penetrating through the calibration mask pattern, thereby the beam position onto the calibration mask pattern being gradually changed.
Figure 12B:
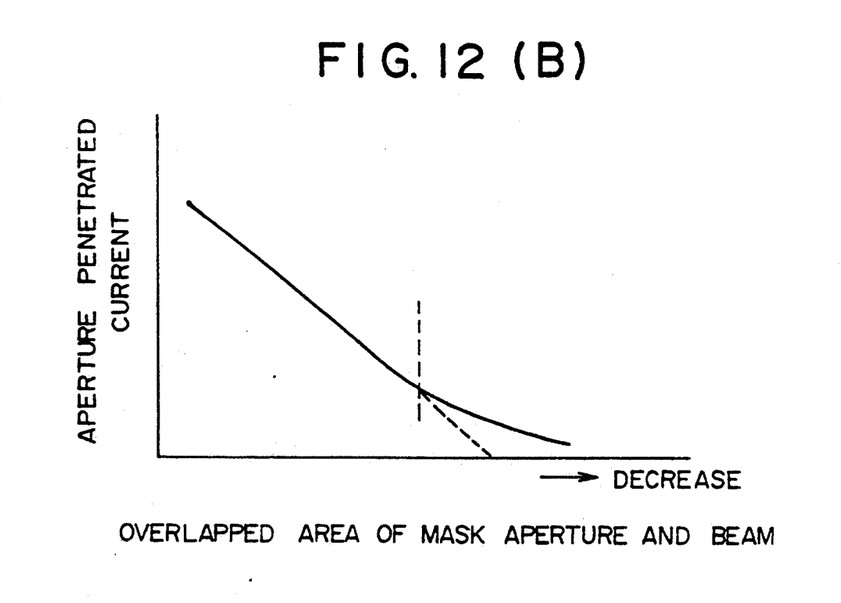

Next, compensation method III provides another method of precisely correcting aberration caused on the upstream side of the stencil mask 20. In order to determine the compensation conditions for the focus compensation coil 41 and the astigmatism compensation coil 42, a calibration pattern mask 90 shown in FIG. 12(a) is utilized, in which a plurality of rectangular holes 92 (each rectangular hole may be considered as one block of stencil pattern) are arranged at regular intervals within deflection ranges of the electron beam by the mask inlet deflectors 21, 22. The electron beam is deflected onto selected one 92' of the rectangular hole patterns and the beam current which penetrated through the rectangular pattern is measured on a wafer. When the electron beam position is made to move gradually, the beam current changes depending on the overlapped area 96 (cross hatched area) of the electron beam having a cross section 94 (hatched area) and the rectangular hole pattern 92', which is plotted in FIG. 12(b) by changing the overlapped area. The plotted curve shows that, when the overlapped area 96 decreases, the curve separates from a linear decreasing line.

Figure 13A:
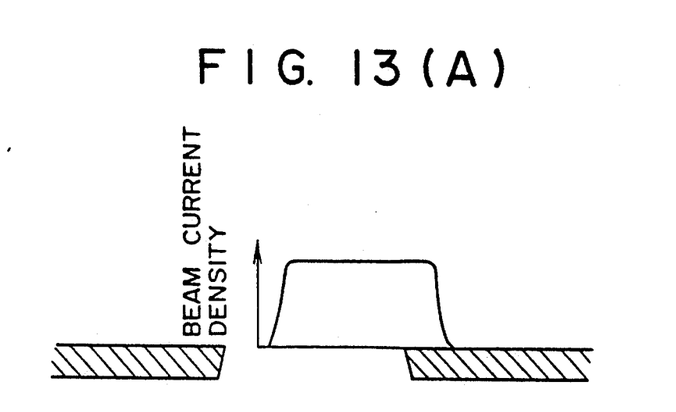
FIGS. 13(a) and 13(b), and FIG. 14 illustrate a method of adjusting aberration compensation coils on the upstream side of a stencil mask in accordance with the present invention.
Figure 13B:
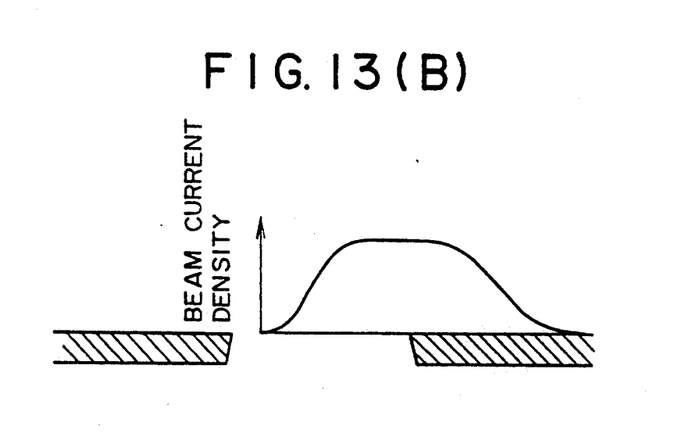
Figure 14:
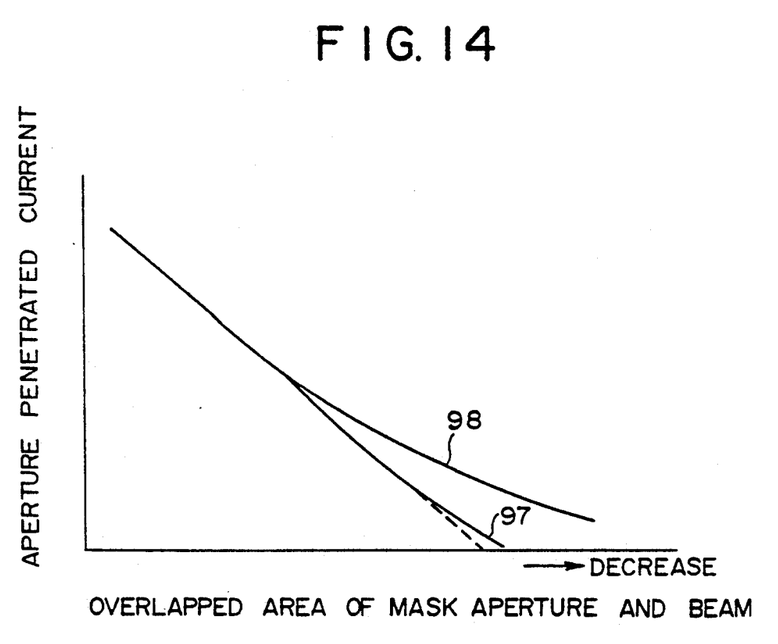

In an ideal case that electron beam forms a sharp image on the stencil mask, namely, beam current density curve shows a sharp step, which is schematically shown superposed on the cross sectional view of the pattern opening in FIG. 13(a), the penetrated beam current shown by a curve 97 in FIG. 14 shows a substantially linear characteristic. On the contrary, in the case the electron beam current density is not uniform or the beam current density curve shows a gradual change such as shown in FIG. 13(b), the penetrated beam current 98 in FIG. 14 does not show a linear characteristic but shows discrepancy from the linear line. By adjusting currents for the focus compensation coil 41 and the astigmatism compensation coil 42, the above discrepancy is made minimum as much as possible.

These current data for the optimum condition are recorded as the required compensation coil currents at the specified pattern position on the stencil mask. Tests are repeated for other pattern positions on the calibration pattern mask and recorded. The optimum compensation current data depending on the stencil pattern position thus obtained are stored in the data memory 54 and storage memory 51 in the control unit 50.

Other Improvements

In FIG. 1, axial positions of magnetic lenses 18, 19 are respectively arranged outside the mask inlet deflectors 21, 22 and the mask outlet deflectors 23, 24 with respect to the stencil mask 20. And further, the focus compensation coils 41, 44 and the astigmatism compensation coils 42, 45 are arranged axially outside the magnetic lenses 18, 19 with respect to the stencil mask. These arrangements make the beam travel distance longer and the overall length of exposure unit 10 also longer. The electron beam becomes susceptible to stray magnetic field from the outside and to electron charges which are stored on the contaminated inside wall of the exposure unit column. Therefore, the above magnetic lenses 18, 19, mask inlet and outlet deflectors 21, 22, 23, 24, and compensation coils 41, 42, 44, 45 are preferable to be assembled compact as much as possible.

Figure 15:
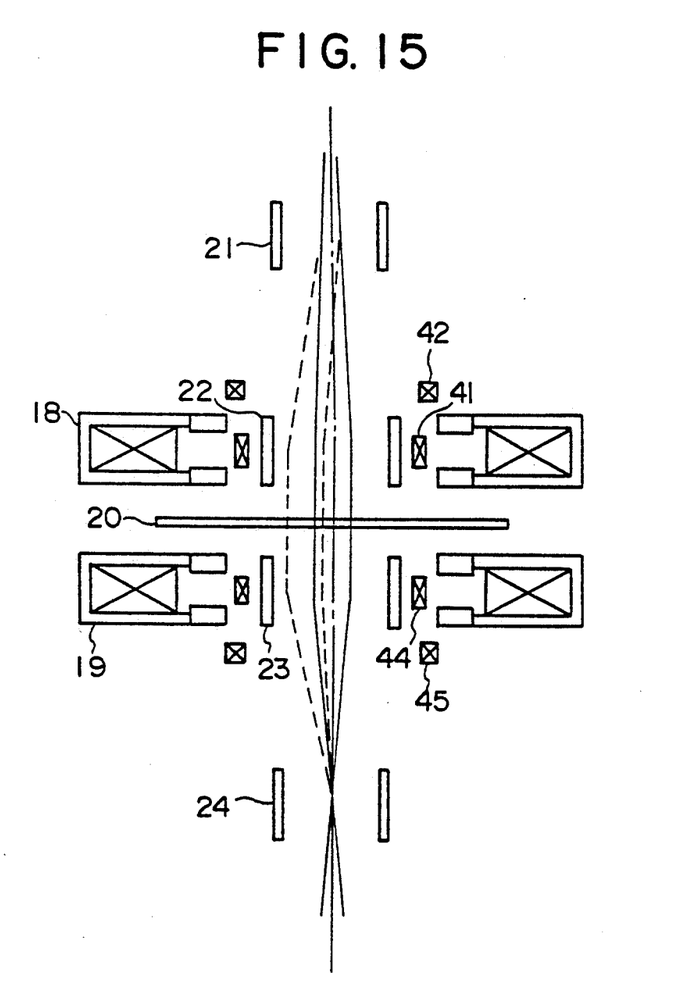
FIG. 15 shows a schematic cross sectional view of arrangements of magnetic lenses, deflectors and aberration compensation coils in accordance with the present invention, thereby the magnetic lenses being disposed in close vicinity of a stencil mask.

FIG. 15 shows an improvement for attaining this purpose, in which both magnetic lenses 18, 19 are arranged very close to the stencil mask 20, and the second mask inlet deflector 22 and first mask outlet deflector 23 are arranged inside the magnetic lenses 18, 19 respectively, and further the focus compensation coils 41, 44 are arranged close to the magnetic lenses 18, 19 respectively. The above improvement makes the overall length of the beam passage shorter, and effects of outside stray magnetic field and electron charges on the contaminated wall surface lighter.

The present invention may be embodied in other specific forms. The presently disclosed embodiments are, therefore, to be considered in all respects as illustrative and not restrictive, the scope of the invention being indicated by the appended claims, rather than the foregoing description, and all changes which come within the meaning and range of equivalence of the claims are, therefore, to be embraced therein.

We claim:

1. An improved lithography system, comprising a source for generating a charged-particle beam, a stencil mask having a plurality of blocks of stencil pattern, first and second mask inlet deflectors arranged on the upstream side of the stencil mask, first and second mask outlet deflectors arranged on the downstream side of the stencil mask, and a lens system including first and second magnetic lenses arranged respectively on the upstream and downstream sides of the stencil mask, whereby said charged-particle beam is deflected from the axis onto a selected block of stencil pattern by said first and second mask inlet deflectors, and said charged-particle beam, outline of which is shaped to the stencil pattern due to the beam penetration, is deflected back to the axis by said first and second mask outlet deflectors and finally the charged-particle beam forms an image of said stencil pattern on an objective, the improvement comprising:

at least one compensation coil disposed on the upstream side of said stencil mask, thereby aberration of the incident charged-particle beam onto said stencil mask being corrected forming a sharp image of an aperture pattern on the stencil mask.

2. A lithography system as recited in claim 1, wherein said system comprises a plurality of said compensation coils, including an astigmatism compensation coil for correcting astigmatism and a focus compensation coil for correcting field curvature.

3. An improved lithography system, comprising a source for generating a charged-particle beam, a stencil mask having a plurality of blocks of stencil pattern, first and second mask inlet deflectors arranged on the upstream side of the stencil mask, first and second mask outlet deflectors arranged on the downstream side of the stencil mask, and a lens system including first and second magnetic lenses arranged respectively on the upstream and downstream sides of the stencil mask, whereby said charged-particles beam is deflected from the axis onto a selected block of stencil pattern by said first and second mask inlet deflectors, and said charged-particle beam, outline of which is shaped to the stencil pattern due to the beam penetration, is deflected back to the axis by said first and second mask outlet deflectors and finally the charged-particle beam forms an image of said stencil pattern on an objective, the improvement comprising:

at least one first and at least one second compensation coils disposed, respectively, on upstream and downstream sides of said stencil mask, thereby aberration of the incident charged-particle beam onto said stencil mask being corrected by the first compensation coil forming a sharp image of an aperture pattern on the stencil mask, and aberration of the mask-penetrated charged-particle beam being corrected by the second compensation coil forming a sharp image of said stencil pattern on the objective.

4. A lithography system as recited in claim 3, wherein said system comprises a plurality of said first compensation coils, including a first astigmatism compensation coil for correcting astigmatism and a first focus compensation coil for correcting field curvature, and said system comprises a plurality of said second compensation coils, including a second astigmatism compensation coil for correcting astigmatism and a second focus compensation coil for correcting field curvature.

5. A lithography system, comprising
    a source for generating a charged-particle beam;
    a stencil mask having a plurality of blocks of stencil pattern;
    first and second mask inlet deflectors arranged on the upstream side of the stencil mask;
    first and second mask outlet deflectors arranged on the downstream side of the stencil mask;
    a lens system including first and second magnetic lenses arranged respectively on the upstream and downstream sides of the stencil mask, whereby said charged-particle beam is deflected from the axis onto a selected block of stencil pattern by said first and second mask inlet deflectors, and said charged-particle beam, an outline of which is shaped to the stencil pattern due to the beam penetration, is deflected back to the axis by said first and second mask outlet deflectors and finally the charged-particle beam forms an image of said stencil pattern on an objective, said first and second magnetic lenses being arranged in close proximity to said stencil mask, and said second mask inlet deflector is disposed inside said first magnetic lens and said first mask outlet deflector is disposed inside said second magnetic lens;
    a first focus compensation coil disposed in close proximity to said first magnetic lens; and
    a second focus compensation coil disposed in close proximity to said second magnetic lens, thereby field curvature of the incident charged-particle beam onto said stencil mask being corrected by the first focus compensation coil forming a sharp image of an aperture pattern on the stencil mask, and field curvature of the mask-penetrated charged-particle beam being corrected by the second focus compensation coil forming a sharp image of said stencil pattern on the objective.

6. A method of exposure using a lithography system, including a source for generating a charged-particle beam, a stencil mask having a plurality of blocks of stencil pattern, first and second mask inlet deflectors arranged on the upstream side of the stencil mask, first and second mask outlet deflectors arranged on the downstream side of the stencil mask, a lens system including two magnetic lenses arranged respectively on the upstream and downstream sides of the stencil mask, and further a first and second compensation coil disposed respectively on the upstream and downstream sides of said stencil mask, whereby said charged-particle beam is deflected from the axis onto a selected block of stencil pattern by said first and second mask inlet deflectors, and said charged-particle beam, outline of which is shaped to the stencil pattern due to the beam penetration, is deflected back to the axis by said first and second mask outlet deflectors, and the charged-particle beam forms an image of said stencil pattern on an objective,     said exposure method being capable of optimizing said first and second compensation coil currents for correcting aberration of the charged-particle beam (hereinafter abbreviated as beam) during the beam passage on the upstream and downstream sides of the stencil mask, comprising the steps of:

(a) providing a calibration pattern mask in place of said stencil mask, the calibration pattern mask comprising either or both of a plurality of first stencil patterns and a plurality of second stencil patterns, each cross section of first and second stencil patterns being respectively smaller and larger than a cross-section of the beam on the stencil mask,     (b) projecting the beam on a selected one of the first stencil patterns on the calibration pattern mask such that the beam cross section completely covers the first stencil pattern,     (c) adjusting the second compensation coil current on the downstream side of the calibration pattern mask such that a sharp image can be obtained on the objective,     (d) repeating steps (b) and (c) for the other first stencil patterns having a different distance from the axis,     (e) projecting the beam on a selected one of the second stencil patterns on the calibration pattern mask such that the beam cross section is completely included in the second stencil pattern,     (f) adjusting the first compensation coil current on the upstream side of the calibration pattern mask such that a sharp image can be obtained on the objective, and     (g) repeating steps (e) and (f) for the other second stencil patterns having a different distance from the axis.

7. A method of exposure as recited in claim 6, wherein said aberration is astigmatism, and said first and second compensation coils are astigmatism compensation coils.

8. A method of exposure as recited in claim 6, wherein said aberration is field curvature, and said first and second compensation coils are focus compensation coils.

9. A method of exposure as recited in claim 6, wherein said aberration includes both astigmatism and field curvature, and said first and second compensation coils respectively comprise an astigmatism compensation coil and a focus compensation coil.

10. A method of exposure using a lithography system including a source for generating a charged-particle beam, a stencil mask having a plurality of blocks of stencil pattern, first and second mask inlet deflectors arranged on the upstream side of the stencil mask, first and second mask outlet deflectors arranged on the downstream side of the stencil mask, a lens system including two magnetic lenses arranged respectively on the upstream and downstream sides of the stencil mask, and further a compensation coil and an aperture disposed on the downstream side of said stencil mask, whereby said charged-particle beam is deflected from the axis onto a selected block of stencil pattern by said first and second mask inlet deflectors, and said charged-particle beam, outline of which is shaped to the stencil pattern due to the beam penetration through the stencil pattern, is deflected back to the axis by said first and second mask outlet deflectors, and the converged charged-particle beam passes through said aperture and finally forms an image of said stencil pattern on an objective, said exposure method being capable of optimizing said compensation coil current for correcting aberration of the charged-particle beam (hereinafter abbreviated as beam) during the beam passage on the downstream side of the stencil mask, comprising the steps of:

(a) forming a beam which penetrates through a selected block of stencil pattern and further through the aperture, thereby the beam current arriving at the objective being measured, (b) making a small change in current flowing through said compensation coil, which results in making the beam position on the aperture deviate and the beam sharpness change, (c) adjusting said mask inlet and outlet deflectors such that the beam position returns back to the initial position on the aperture by detecting the maximum beam current on the objective, thereby the maximum beam current and the beam position shift on the objective being measured, (d) repeating the above step (c) such that (aperture penetrated beam current)/(amount of the beam shift on the objective) becomes maximum.

(e) repeating the above steps (b) through (d) by further changing the compensation coil current, thereby the maximum aperture penetrated beam current being recorded at each repetition step, and (f) obtaining a most appropriate compensation coil current at which the aperture penetrated beam current shows the maximum point in the step (e).

11. A method of exposure as recited in claim 10, wherein said aberration is astigmatism, and said compensation coil is an astigmatism compensation coil.

12. A method of exposure as recited in claim 10, wherein said aberration is field curvature, and said compensation coil is a focus compensation coil.

13. A method of exposure as recited in claim 10, wherein said aberration includes both astigmatism and field curvature, and said compensation coil comprises an astigmatism compensation coil and a focus compensation coil.

14. A method of exposure using a lithography system including a source for generating a charged-particle beam, a stencil mask having a plurality of blocks of stencil pattern, first and second mask inlet deflectors arranged on the upstream side of the stencil mask, first and second mask outlet deflectors arranged on the downstream side of the stencil mask, a lens system including two magnetic lenses arranged respectively on the upstream and downstream sides of the stencil mask, and further a compensation coil disposed on the upstream side of said stencil mask, whereby said charged-particle beam is deflected from the axis onto a selected block of stencil pattern by said first and second mask inlet deflectors, and said charged-particle beam, outline of which is shaped to the stencil pattern due to the beam penetration through the stencil pattern, is deflected back to the axis by said first and second mask outlet deflectors, and the charged-particle beam finally forms an image of said stencil pattern on an objective, said exposure method being capable of optimizing said compensation coil current for correcting aberration of the charged-particle beam (hereinafter, abbreviated as beam) during the beam passage on the upstream side of the stencil mask, comprising the steps of:

(a) providing a calibration pattern mask in place of said stencil mask, the calibration pattern mask comprising a plurality of same stencil calibration patterns, and making a beam penetrate through a selected one of calibration patterns, thereby the beam current penetrating through the selected calibration pattern and arriving at the objective being measured, (b) maintaining the current flowing through said compensation coil constant, (c) moving the beam incident position onto the selected calibration pattern such that the overlapped area of beam cross section and calibration pattern gradually changes, thereby beam current versus overlapped area data being measured.

(d) changing the compensation coil current to another constant value, and repeating the step (c), (e) repeating the step (d) plural times, and (f) obtaining the compensation coil current, with which the relation between beam current versus overlapped area shows the most linear characteristic among plural conditions of the above steps (b) to (e).

15. A method of exposure as recited in claim 14, wherein said aberration is astigmatism, and said compensation coil is an astigmatism compensation coil.

16. A method of exposure as recited in claim 14, wherein said aberration is field curvature, and said compensation coil is a focus compensation coil.

17. A method of exposure as recited in claim 14, wherein said aberration includes both astigmatism and field curvature, and said compensation coil comprises an astigmatism compensation coil and a focus compensation coil.

18. A method of exposure as recited in claims 10 or 17, wherein the compensation coil current needed for the specified block position of the stencil pattern is repeatedly measured for other block positions of stencil pattern, and compensation current data and block position data thus obtained are stored in a memory of a control unit of the lithography system.

* * * * *